US010217880B2

(12) United States Patent
Cousins

(10) Patent No.: US 10,217,880 B2
(45) Date of Patent: Feb. 26, 2019

(54) VOLTAGE BREAKDOWN DEVICE FOR SOLAR CELLS

(71) Applicant: SUNPOWER CORPORATION, San Jose, CA (US)

(72) Inventor: Peter John Cousins, Los Altos, CA (US)

(73) Assignee: SunPower Corporation, San Jose, CA (US)

( * ) Notice: Subject to any disclaimer, the term of this patent is extended or adjusted under 35 U.S.C. 154(b) by 212 days.

(21) Appl. No.: 15/085,594

(22) Filed: Mar. 30, 2016

(65) Prior Publication Data

US 2017/0288068 A1 Oct. 5, 2017

(51) Int. Cl.
| | |
|---|---|
| H01L 31/028 | (2006.01) |
| H01L 31/0216 | (2014.01) |
| H01L 31/0224 | (2006.01) |
| H01L 31/18 | (2006.01) |
| H01L 31/0443 | (2014.01) |

(52) U.S. Cl.
CPC .... *H01L 31/0284* (2013.01); *H01L 31/02168* (2013.01); *H01L 31/022425* (2013.01); *H01L 31/022441* (2013.01); *H01L 31/0443* (2014.12); *H01L 31/1804* (2013.01); *Y02E 10/50* (2013.01)

(58) Field of Classification Search
CPC ............. H01L 31/0284; H01L 31/1804; H01L 31/022425; H01L 31/02168
See application file for complete search history.

(56) References Cited

U.S. PATENT DOCUMENTS

| | | | | |
|---|---|---|---|---|
| 4,933,022 | A | * | 6/1990 | Swanson ............... H01L 27/142 136/244 |
| 8,134,217 | B2 | | 3/2012 | Rim et al. |
| 2007/0113884 | A1 | | 5/2007 | Kinsey et al. |
| 2009/0308438 | A1 | | 12/2009 | De Ceuster et al. |
| 2010/0139764 | A1 | | 6/2010 | Smith |
| 2011/0284986 | A1 | * | 11/2011 | Rim ...................... H01L 29/861 257/510 |
| 2012/0204926 | A1 | * | 8/2012 | Harley ............ H01L 31/022441 136/244 |
| 2012/0318321 | A1 | | 12/2012 | Lu et al. |
| 2015/0179847 | A1 | | 6/2015 | Rim et al. |

OTHER PUBLICATIONS

Extended European Search Report in European Patent Application No. 17163722.6 dated Jul. 28, 2017, 10 pages.

\* cited by examiner

*Primary Examiner* — Devina Pillay
(74) *Attorney, Agent, or Firm* — Schwabe, Williamson & Wyatt, P.C.

(57) ABSTRACT

Voltage breakdown devices for solar cells are described. For example, a solar cell includes a semiconductor substrate. A plurality of alternating N-type and P-type semiconductor regions is disposed in or above the substrate. A plurality of conductive contacts is coupled to the plurality of alternating N-type and P-type semiconductor regions. A voltage breakdown device is disposed above the substrate. The voltage breakdown device includes one of the plurality of conductive contacts in electrical contact with one of the N-type semiconductor regions and with one of the P-type semiconductor regions of the plurality of alternating N-type and P-type semiconductor regions disposed in or above the substrate.

10 Claims, 5 Drawing Sheets

VOLTAGE BREAKDOWN DEVICE FOR SOLAR CELLS

TECHNICAL FIELD

Embodiments of the present disclosure are in the field of renewable energy and, in particular, include voltage breakdown devices for solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current tram the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques fir increasing the efficiency in the manufacture of solar cells, are generally desirable. Some embodiments of the present disclosure allow for increased solar cell efficiency by providing solar cell structures having voltage breakdown devices.

DETAILED DESCRIPTION

Figure 1:
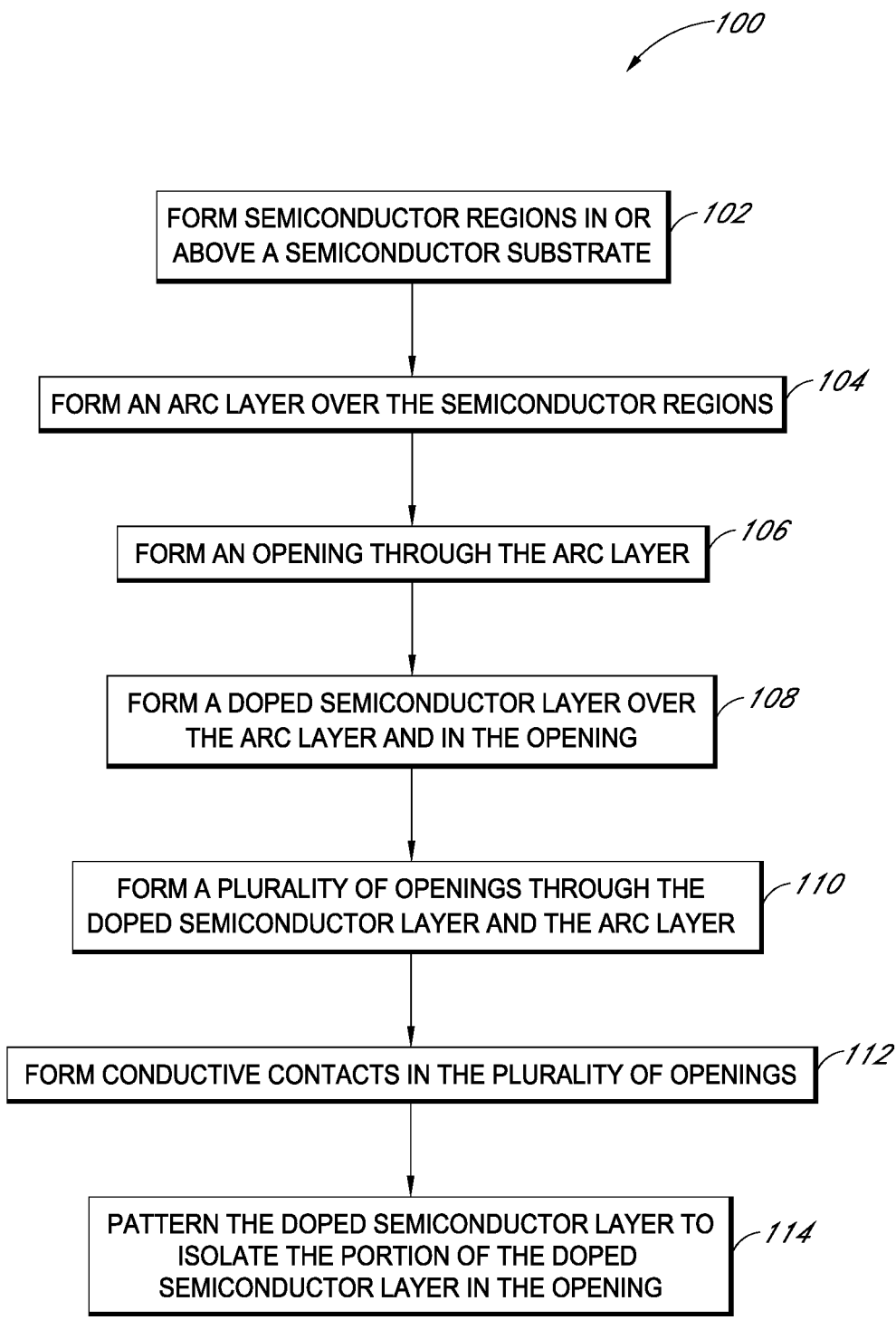
FIG. 1 is a flowchart listing operations in a method of fabricating a solar cell as corresponding to FIGS. 2A-2D, 3A and 3B, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology

The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit component can be said to be configured to perform the task even when the specified unit/component is not currently operational (e.g., is not on active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily, mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Voltage breakdown devices for solar cells are described herein. In the following description, numerous specific details are set forth, such as specific voltage breakdown device architectures, in order to provide a thorough understanding of embodiments of the present disclosure. It will be apparent to one skilled in the art that embodiments of the present disclosure may be practiced without these specific details. In other instances, well-known fabrication techniques, such as emitter region fabrication techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells. In one embodiment, a solar cell includes a semiconductor substrate. A plurality of alternating N-type and P-type semiconductor regions is disposed in or above the substrate. A plurality of conductive contacts is coupled to the plurality of alternating N-type and P-type semiconductor regions. A voltage breakdown device is disposed above the substrate. The voltage breakdown device includes one of the plurality of conductive contacts in electrical contact with one of the N-type semiconductor regions and with one of the P-type semiconductor regions of the plurality of alternating N-type and P-type semiconductor regions disposed in or above the substrate.

Also disclosed herein are methods of fabricating solar cells. In one embodiment, a method of fabricating a solar cell includes forming a plurality of alternating N-type and P-type semiconductor regions in or above a semiconductor substrate. The method also includes forming an anti-reflective coating (ARC) layer over the plurality of alternating N-type and P-type semiconductor regions in or above a semiconductor substrate. The method also includes forming an opening through the ARC layer to expose a portion of one of the plurality of alternating N-type and P-type semiconductor regions. The method also includes forming a doped semiconductor layer over the ARC layer, a portion of the doped semiconductor layer formed in the opening. The method also includes forming a plurality of openings through the doped semiconductor layer and the ARC layer to expose portions of each of the plurality of alternating N-type and P-type semiconductor regions. The method also includes forming a plurality of conductive contacts in the plurality of openings, wherein one of the plurality of conductive contacts is formed in one of the plurality of openings and on the portion of the doped semiconductor layer in the opening. The method also includes patterning the doped semiconductor layer to isolate the portion of the doped semiconductor layer in the opening.

Also disclosed herein are methods of operating solar cells. In one embodiment, a method of operating a solar cell includes providing a solar cell including a semiconductor substrate, a plurality of alternating N-type and P-type semiconductor regions disposed in or above the substrate, and a plurality of conductive contacts coupled to the plurality of alternating N-type and P-type semiconductor regions. The method also includes mitigating a high voltage or high thermal event at a region of the solar cell including one of the plurality of conductive contacts in electrical contact with one of the N-type semiconductor regions and with one of the P-type semiconductor regions of the plurality of alternating N-type and P-type semiconductor regions disposed in or above the substrate.

One or more embodiments described herein provides an approach for fabricating voltage breakdown devices for solar cells. One or more embodiments includes voltage breakdown devices integrated with solar cells. Some embodiments are suitable for solar cells fabricated from N-type monocrystalline silicon substrates, while other embodiments are suitable for solar cells fabricated from P-type monocrystalline silicon substrates.

To provide context, breakdown voltage for solar cells would be advantageous for solar cell usage. Certain solar cell architectures have demonstrated that an abrupt PN junction can provide a breakdown voltage of approximately 1 Volt for a solar cell. However, such a breakdown voltage may be advantageous if included on a variety of solar cell architectures. For example, a breakdown voltage of approximately 1 Volt may be desirable for architectures that do not require butting junction engineering.

Addressing one or more of the above issues, in accordance with an embodiment of the present disclosure, devices described herein enable an approximately 1 volt breakdown for a variety of solar cell architectures. In one such embodiment, a voltage breakdown device is integrated with a solar cell. In an embodiment, such a voltage breakdown device inhibits a solar cell from going into reverse, e.g., by providing reverse bias protection circuitry. In one embodiment, the voltage breakdown device accommodates a high voltage solar cell event. In another embodiment, the voltage breakdown device accommodates a high temperature solar cell event.

In an exemplary process flow, FIGS. 2A-2D illustrate cross-sectional views of various stages in the fabrication of a solar cell, in accordance with an embodiment of the present disclosure. FIG. 1 is a flowchart 100 listing operations in a method of fabricating a solar cell as corresponding to FIGS. 2A-2D (and further corresponding to FIGS. 3A and 3B described below), in accordance with an embodiment of the present disclosure.

Figure 2A:
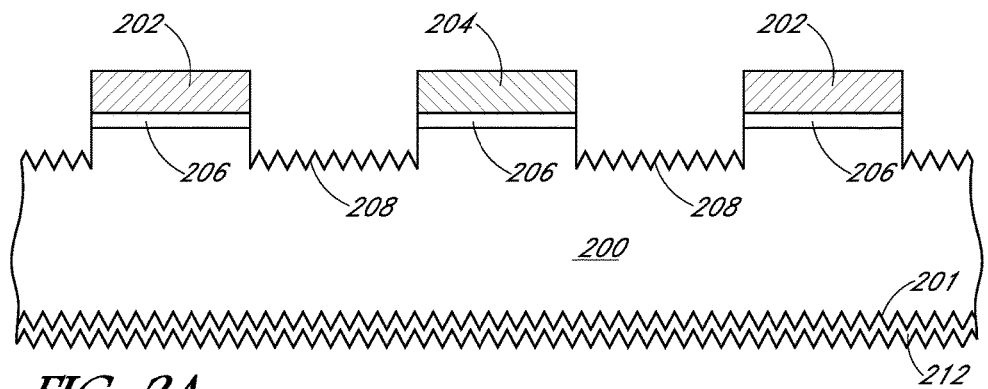
FIGS. 2A-2D illustrate cross-sectional views of various stages in the fabrication of a solar cell, in accordance with an embodiment of the present disclosure.

Referring to operation 102 of flowchart 100 and to corresponding FIG. 2A, a method of fabricating a solar cell includes forming a plurality of semiconductor regions 202/204 above a substrate 200. A thin dielectric material 206 may be included as an intervening material between the semiconductor regions 202/204 and the substrate 200. The substrate 200 has a light-receiving surface 201 opposite a back surface above which the plurality of semiconductor regions 202/204 is formed. In an embodiment, as depicted in FIG. 2A, each of the plurality of semiconductor regions 202/204 is spaced apart from one another. In a specific embodiment, the plurality of semiconductor regions 202/204 is a plurality of alternating N-type 202 and P-type 204 semiconductor regions.

In an embodiment, the substrate 200 is a monocrystalline silicon substrate, such as a bulk single crystalline N-type doped silicon substrate. In other embodiments, the substrate 200 is a monocrystalline silicon substrate, such as a bulk single crystalline P-type doped silicon substrate. It is to be appreciated, however, that substrate 200 may be a layer, such as a multi-crystalline silicon layer, disposed on a global solar cell substrate. In an embodiment, the thin dielectric layer 206 is a tunneling silicon oxide layer having a thickness of approximately 2 nanometers or less. In one such embodiment, the term "tunneling dielectric layer" refers to a very thin dielectric layer, through which electrical conduction can be achieved. The conduction may be due to quantum tunneling and/or the presence of small regions of direct physical connection through thin spots in the dielectric layer. In one embodiment, the tunneling dielectric layer is or includes a thin silicon oxide layer.

In an embodiment, in the case that the plurality of semiconductor regions 202/204 is a plurality of alternating N-type 202 and P-type 204 semiconductor regions, the alternating N-type and P-type semiconductor regions 202 and 204, respectively, are polycrystalline silicon regions firmed by, e.g., using a plasma-enhanced chemical vapor deposition (PECVD) process. In one such embodiment, the N-type polycrystalline silicon regions 202 are doped with an N-type impurity, such as phosphorus. The P-type polycrystalline silicon regions 204 are doped with a P-type impurity, such as boron. As is depicted in FIG. 2A, the alternating N-type and P-type semiconductor regions 202 and 204 may have trenches 208 formed there between, the trenches 208 extending partially into the substrate 200.

In an embodiment, the light receiving surface 201 is a texturized light-receiving surface, as is depicted in FIG. 2A. In one embodiment, a hydroxide-based wet etchant is employed to texturize the light receiving surface 201 of the substrate 200 and, possibly, the trench 208 surfaces as is also depicted in FIG. 2A. It is to be appreciated that the timing of the texturizing of the light receiving surface may vary. For example, the texturizing may be performed before or after the formation of the thin dielectric layer 206. In an embodiment, a texturized surface may be one which has a regular or an irregular shaped surface for scattering incoming light, decreasing the amount of light reflected off of the light receiving surface 201 of the solar cell. Referring again to FIG. 2A, additional embodiments can include formation of a passivation and/or anti-reflective coating (ARC) layers (shown collectively as layer 212) on the light-receiving surface 201. It is to be appreciated that the tinting of the formation of passivation and/or ARC layers may also vary.

In an embodiment, the plurality of semiconductor regions 202/204 is formed from a polycrystalline silicon layer formed above the substrate 200, which ma be single crystalline silicon substrate, as described above. In another embodiment, however, the substrate 200 is a single crystalline silicon substrate having the plurality of semiconductor regions 201/204 formed therein, e.g., as diffusion regions, as opposed to being formed in a semiconductor layer distinct from the substrate 200.

Figure 2B:
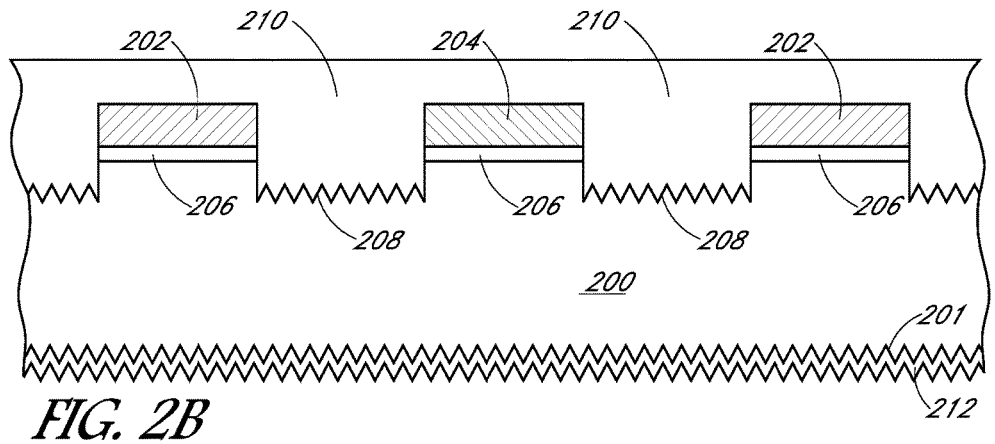

Referring now to operation 104 of flowchart 100 and to corresponding FIG. 2B, the method of fabricating a solar cell further includes forming an anti-reflective coating (ARC) layer 210 over the plurality of alternating N-type and P-type, semiconductor regions 202/204. In an embodiment, the ARC layer 210 is formed in the trenches 208 and between and partially on the alternating N-type and P-type semiconductor regions 202 and 204, as is depicted in FIG. 2B. In a specific embodiment, the ARC layer 210 is or includes a material such as, but not limited to, a silicon nitride material or a silicon oxynitride material.

Figure 2C:
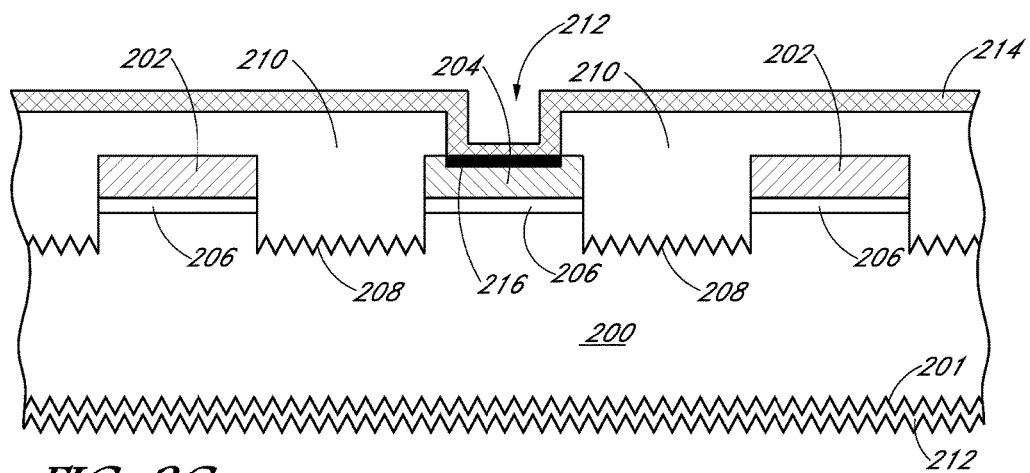

Referring now to operation 106 of flowchart 100 and to corresponding FIG. 2C, the method of fabricating a solar cell further includes forming an opening 212 through the ARC layer 210 to expose a portion of one of the plurality of alternating N-type 202 and P-type 204 semiconductor regions. In one embodiment, the substrate 200 is a bulk single crystalline N-type doped silicon substrate, and the opening 212 exposes a portion of one of the P-type semiconductor regions 204, as is depicted in FIG. 2C. In another embodiment, however, the substrate 200 is a bulk single crystalline P-type doped silicon substrate, and the opening 212 exposes a portion of one of the N-type semiconductor regions 202. In an embodiment, the opening 212 is formed using a laser ablation process.

Referring now to operation 108 of flowchart 100 and again to corresponding FIG. 2C, the method of fabricating a solar cell further includes forming a doped semiconductor layer 214 over the ARC layer 210. A portion of the doped semiconductor layer 214 formed in the opening 212. In one embodiment, the substrate 200 is a bulk single crystalline N-type doped silicon substrate, the opening 212 exposes a portion of one of the P-type semiconductor regions 204, and the doped semiconductor layer 214 is an N-type doped semiconductor layer, as is depicted in FIG. 2C. In another embodiment, however, the substrate 200 is a bulk single crystalline P-type doped silicon substrate, the opening 212 exposes a portion of one of the N-type semiconductor regions 202, and the doped semiconductor layer 214 is a P-type doped semiconductor layer. In either case, in an embodiment the semiconductor layer 214 is an amorphous silicon semiconductor layer, e.g., formed by plasma enhanced chemical vapor deposition (PECVD). In the case that the doped semiconductor layer 214 is an N-type doped semiconductor layer, in one such embodiment, the doped semiconductor layer 214 is an amorphous silicon layer heavily doped with phosphorous or arsenic impurities. In the case that the doped semiconductor layer 214 is a P-type doped semiconductor layer, in another such embodiment, the doped semiconductor layer 214 is an amorphous silicon layer heavily doped with boron impurities.

Referring again to FIG. 2C, in an embodiment, the portion of the one of the plurality of alternating N-type 202 and P-type 204 semiconductor regions exposed by opening 212 has a tunneling dielectric layer 216 formed thereon. In one such embodiment, the portion of the one of the plurality of alternating N-type 202 and P-type 204 semiconductor regions exposed by opening 212 is oxidized by thermal oxidation to form the tunneling dielectric layer 216. In another embodiment, the portion of the one of the plurality of alternating N-type 202 and P-type 204 semiconductor regions has a dielectric layer deposited thereon which is ultimately confined to opening 212. In either case, in an embodiment, the tunneling dielectric layer 216 is implemented to ensure that an abrupt P/N junction is retained between the doped semiconductor layer 214 and the one of the plurality of alternating N-type 202 and P-type 204 semiconductor regions exposed by opening 212. In one such embodiment, the tunneling dielectric layer 216 ensures that donuts do not exchange between the doped semiconductor layer 214 and the one of the plurality of alternating N-type 202 and P-type 204 semiconductor regions exposed by opening 212 in a post annealing process. In other embodiments, however, a post annealing process is avoided, which may enable omission of the tunneling dielectric layer 216.

Figure 2D:
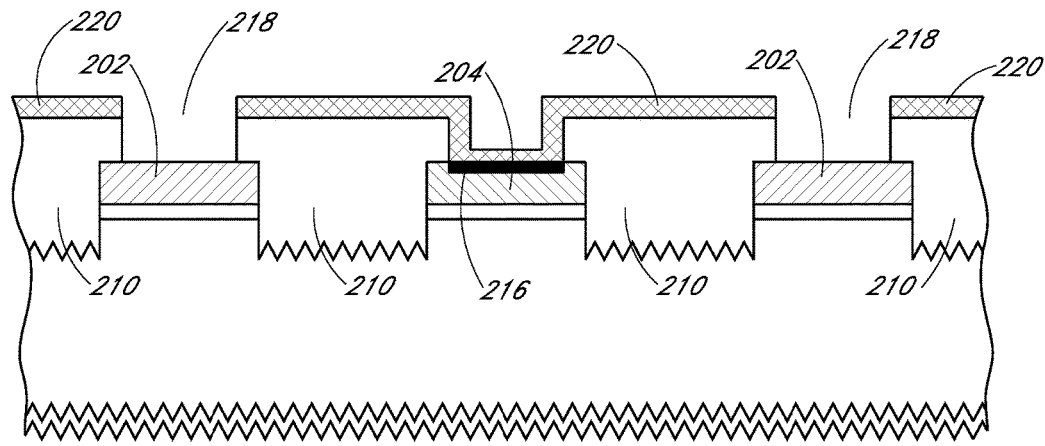

Referring now to operation 110 of flowchart 100 and to corresponding FIG. 21), the method of fabricating a solar cell further includes forming a plurality of openings 218 through the doped semiconductor layer 214 and the ARC layer 208 to expose portions of each of the plurality of alternating N-type 202 and P-type 204 semiconductor regions. In the view of FIG. 2D, openings 218 are shown formed to N-type 202 and P-type semiconductor regions only. However, it is to be appreciated that openings to P-type 204 semiconductor regions are also formed in other locations of the solar cell, is illustrated in and described in association with FIG. 3B. In an embodiment, the openings 218 are formed using a laser ablation process. In a particular embodiment, the opening 212 is formed using a first laser ablation process, and the plurality of openings 218 is formed using a second laser ablation process. The forming of the openings 21 patterns the doped semiconductor layer 214 to provide patterned doped semiconductor layer 220, as is depicted in FIG. 2D.

Figure 3A:
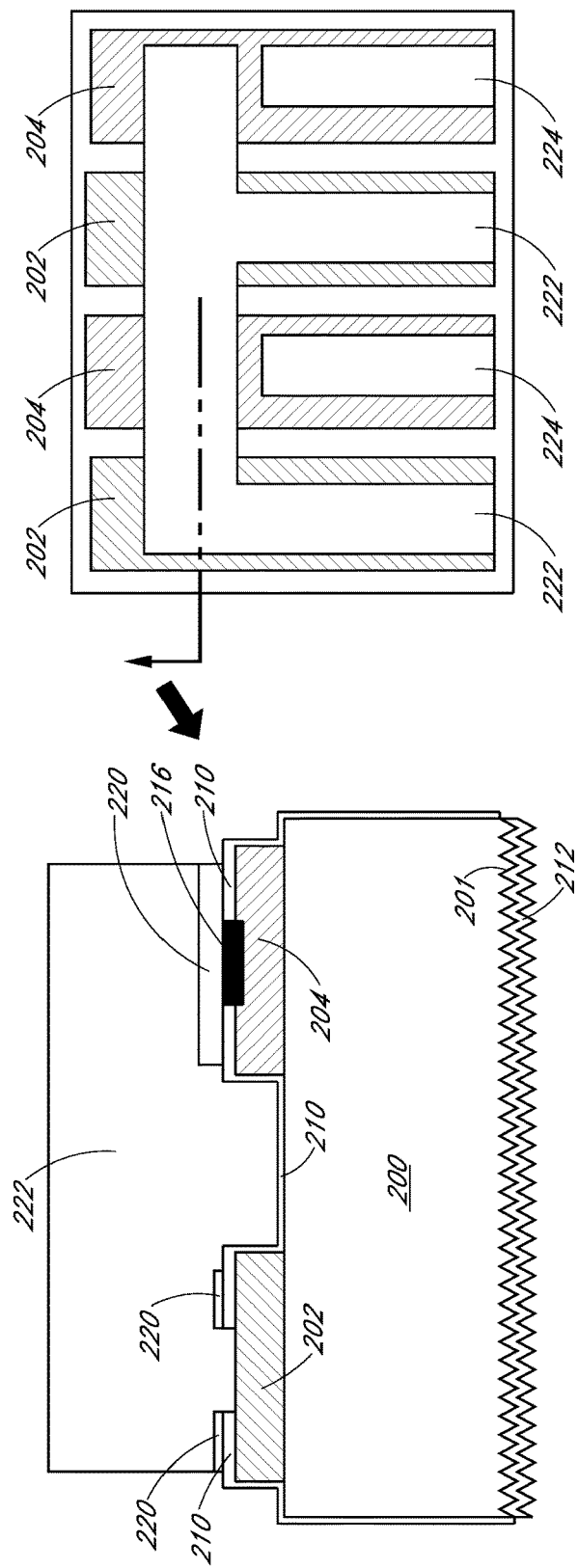
FIG. 3A is a cross-sectional view and corresponding plan view of a first location of a solar cell having a voltage breakdown device, as continued from the process operation of FIG. 2D, in accordance with an embodiment of the present disclosure.
Figure 3B:
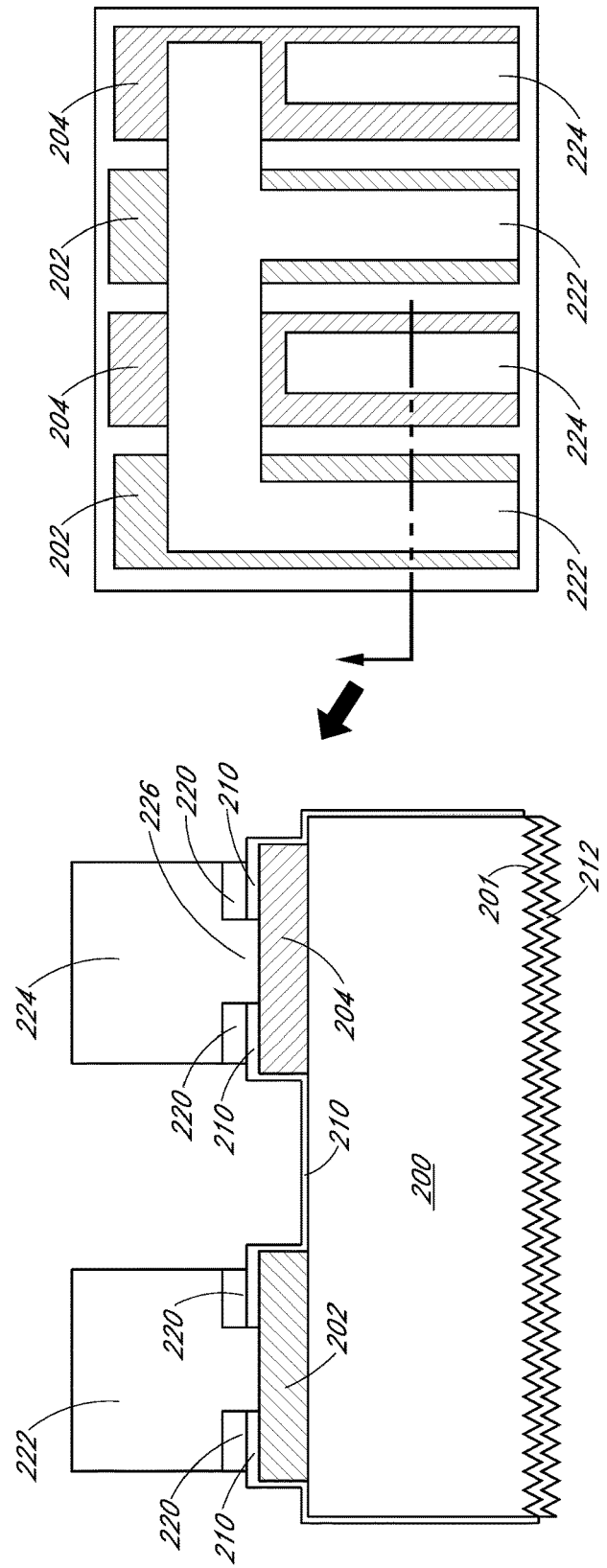
FIG. 3B is a cross-sectional view and corresponding plan view of a second location of a solar cell having a voltage breakdown device, as continued from the process operation of FIG. 2D, in accordance with an embodiment of the present disclosure.

Referring now to operation 112 of flowchart 100 and to corresponding FIGS. 3A and 3B, the method of fabricating a solar cell further includes forming a plurality of conductive contacts 222 and 224 in the plurality of openings 218, wherein one of the plurality of conductive contacts 222 is formed in one of the plurality of openings 218 and on the portion of the patterned doped semiconductor layer 220 in the opening 211.

FIG. 3A is a cross-sectional view and corresponding plan view of a first location of a solar cell having a voltage breakdown device, as continued from the process operation of FIG. 21, in accordance with an embodiment of the present disclosure. Referring to the plan view of FIG. 3A, contacts 224 are formed to electrically connect to P-type regions 204. Contacts 222 are formed to electrically connect to N-type regions 202. However, one of the contacts 222 is formed to contact the patterned doped semiconductor layer 220 disposed above one of the P-type regions 204, with an optional tunneling dielectric layer 216 formed there between, as can be viewed in the cross-sectional view of FIG. 3A. The arrangement provides a P/N junction four use in a voltage breakdown device of the solar cell.

FIG. 3B is a cross-sectional view and corresponding plan view of a second location of a solar cell having a voltage breakdown device, as continued from the process operation of FIG. 2D, in accordance with an embodiment of the present disclosure. Referring to the plan view of FIG. 3B, contacts 224 are formed to electrically connect to P-type regions 204. Contacts 222 are formed to electrically connect to N-type regions 202. The contacts 222 and 224 are isolated from one another in regions of the solar cell different from FIG. 3B, as can be viewed in the cross-sectional view of FIG. 3B.

Referring now to operation 114 of flowchart 100 and to corresponding the cross-sectional view of FIGS. 3A and 3B, the method of fabricating a solar cell also includes further patterning the doped semiconductor layer 214 to isolate the portion of the doped semiconductor layer 214/120 essentially to the opening 212. Such further patterning may ensure that unwanted shorting between N-type and P-type regions does not occur. In one embodiment, the further patterning of the doped semiconductor layer 214/220 is performed subsequent to forming the plurality of conductive contacts 222 and 224. In another embodiment, the further patterning of the doped semiconductor layer 214/220 is performed prior to forming the plurality of conductive contacts 222 and 224.

In an embodiment, the plurality of conductive contacts 222 and 224 are formed by forming a metal seed layer and then performing an electroplating process. In one embodiment, the seed layer is formed by a deposition, lithographic, and etch approach. A metal layer is then electroplated on the patterned metal seed layer. In another embodiment, the plurality of conductive contacts 222 and 224 are formed by printing a paste. The paste may be composed of a solvent and the aluminum/silicon (Al/Si) alloy particles. A subsequent electroplating or electroless-plating process may then be performed.

In an embodiment, the plurality of conductive contacts 222 and 224 are formed by first forming a metal seed layer and then forming a metal foil layer. In an embodiment, the metal seed layer includes a layer having a thickness approximately in the range of 0.05 to 20 microns and includes aluminum in an amount greater than approximately 90 atomic %. In an embodiment, the metal seed layer is deposited as a blanket layer which is later patterned. In another embodiment, the metal seed layer is deposited as patterned layer. In one such embodiment, the patterned metal seed layer is deposited by printing the patterned metal seed layer.

In an embodiment, the metal foil is an aluminum (Al) foil having a thickness approximately in the range of 5-100 microns. In one embodiment, the Al foil is an aluminum alloy foil including aluminum and second element, such as, but not limited to, copper, manganese, silicon, magnesium, zinc, tin, lithium, or combinations thereof in one embodiment, the Al foil is a temper grade foil such as, but not limited to, F-grade (as fabricated), O-grade (full soft), H-grade (train hardened) or T-grade (heat treated). In one embodiment, the aluminum foil is an anodized aluminum foil. In another embodiment, a metal wire formed on the metal seed layer. In one such embodiment, the wire is an aluminum (Al) or copper (Cu) wire. In either case, the metal foil or wire may be welded to the metal seed layer. In the case of a metal foil layer, the metal foil may subsequently be patterned, e.g., by laser ablation and/or etching. Such patterning may position metal toil portions at regions in alignment with locations between the plurality of semiconductor regions 202/204.

In another aspect, a completed solar cell may have a voltage breakdown device disposed thereon, as integrated with the solar cell. Referring again to FIGS. 2A-2D, 3A and 3B, in an embodiment, a solar cell includes a semiconductor substrate 200. A plurality of alternating N-type 202 and P-type 204 semiconductor regions is disposed in or above the substrate 202. A plurality of conductive contacts 222/224 is coupled to the plurality of alternating N-type 202 and P-type 204 semiconductor regions. A voltage breakdown device is disposed above the substrate. The voltage breakdown device includes one of the plurality of conductive contacts (e.g., one of 222 of FIG. 3A) in electrical contact with one of the N-type semiconductor regions 202 and with one of the P-type 204 semiconductor regions of the plurality of alternating N-type and P-type semiconductor regions 202/204 disposed in or above the substrate 200.

In an embodiment, the semiconductor substrate 200 is an N-type semiconductor substrate, and the one of the plurality of conductive contacts 222 is in direct contact with the one of the N-type semiconductor regions (e.g., 202 of the cross-sectional view of FIG. 3A) and is in indirect contact with the one of the P-type semiconductor regions (e.g., 204 of the cross-sectional view of FIG. 3A) of the plurality of alternating N-type and P-type semiconductor regions 202/204. In one such embodiment, an N-type semiconductor layer 220 is disposed between the one of the plurality of conductive contacts 222 and the one of the P-type semiconductor regions 204 of the plurality of alternating N-type and P-type semiconductor regions 202/204. In a specific embodiment, the N-type semiconductor layer 220 is an N-type doped amorphous silicon layer. In another specific embodiment, a tunneling dielectric layer 216 is disposed between the N-type semiconductor layer 220 and the one of the P-type semiconductor regions 204 of the plurality of alternating N-type and P-type semiconductor regions 202/204. In an embodiment, another of the plurality of conductive contacts 224 is in direct contact with the one of the P-type semiconductor regions 204 at a location different from a location where the one of the plurality of conductive contacts 222 is in indirect contact with the one of the P-type semiconductor regions 204 (e.g., the former shown in the cross-sectional view of FIG. 3B and the latter shown in the cross-sectional view of FIG. 3).

In another embodiment, although not depicted, the semiconductor substrate is P-type semiconductor substrate, and the one of the plurality of conductive contacts is in direct contact with the one of the P-type semiconductor regions and is in indirect contact with the one of the S-type semiconductor regions of the plurality of alternating N-type and P-type semiconductor regions. In one such embodiment, a P-type semiconductor layer is disposed between the one of the plurality of conductive contacts and the one of the N-type semiconductor regions of the plurality of alternating N-type and P-type semiconductor regions. In a specific embodiment, the P-type semiconductor layer is a P-type doped amorphous silicon layer, in another specific embodiment, a tunneling dielectric layer is disposed between the P-type semiconductor layer and the one of the N-type semiconductor regions of the plurality of alternating N-type and P-type semiconductor regions. In an embodiment, another of the plurality of conductive contacts is in direct contact with the one of the N-type semiconductor regions at a location different from a location where the one of the plurality of conductive contacts is in indirect contact with the one of the N-type semiconductor regions.

Figure 4:
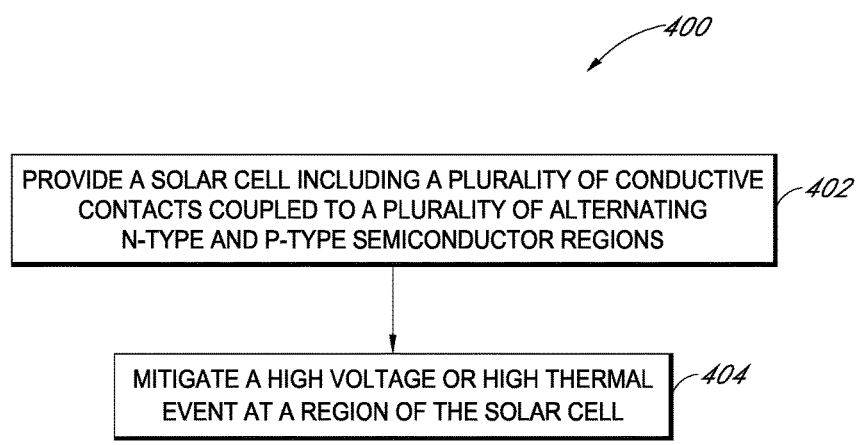
FIG. 4 is a flowchart listing operations in a method of operating a solar cell, in accordance with an embodiment of the present disclosure.

In another aspect, a solar cell includes an integrated voltage breakdown device for accommodating certain events during usage of the solar cell. As an example, FIG. 4 is a flowchart 400 listing operations in a method of operating a solar cell, in accordance with an embodiment of the present disclosure.

Referring to operation 402 of flowchart 400, a method of operating a solar cell includes providing a solar cell including a semiconductor substrate. A plurality of alternating N-type and P-type semiconductor regions is disposed in or above the substrate. A plurality of conductive contacts is coupled to the plurality of alternating N-type and P-type semiconductor regions.

Referring to operation 404 of flowchart 400, the method of operating the solar cell further includes mitigating a high voltage or high thermal event at a region of the solar cell. The region of the solar cell includes one of the plurality of conductive contacts in electrical contact with one of the N-type semiconductor regions and with one of the P-type semiconductor regions of the plurality of alternating N-type and P-type semiconductor regions disposed in or above the substrate.

In an embodiment, the semiconductor substrate is an N-type semiconductor substrate. The one of the plurality of conductive contacts is in direct contact with the one of the N-type semiconductor regions and is in indirect contact with the one of the P-type semiconductor regions of the plurality of alternating N-type and P-type semiconductor regions. In another embodiment, the semiconductor substrate is a P-type semiconductor substrate. The one of the plurality of conductive contacts is in direct contact with the one of the P-type semiconductor regions and is in indirect contact, with the one of the N-type semiconductor regions of the plurality of alternating N-type and P-type semiconductor regions.

Although certain materials are described specifically with reference to above described embodiments, some materials may be readily substituted with others with such embodiments remaining within the spirit and scope of embodiments of the present disclosure. For example, in an embodiment, a different material substrate, such as a group III-V material substrate, can be used instead of a silicon substrate. Furthermore, it is to be understood that, where the ordering of N+ and then P+ type doping is described specifically for emitter regions on a back surface of a solar cell, other embodiments contemplated include the opposite ordering of conductivity type, e.g., P+ and then N+ type doping, respectively. In other embodiments, the above described approaches can be applicable to manufacturing of other than solar cells. For example, manufacturing of light emitting diode (LEDs) may benefit from approaches described herein.

Additionally, although reference is made significantly to back contact solar cell arrangements, it is to be appreciated that approaches described herein may have application to front contact solar cells as well. In a further embodiment, a first side of a wafer or solar cell substrate includes one or more P-type devices, and a second opposite side of the wafer or solar cell substrate includes one or more N-type devices. A voltage breakdown device may thus be fabricated using devices formed on both sides of the voltage or solar cell substrate. Although reference is made herein to a plurality of N-type and/or P-type devices, it is to be appreciated that in certain embodiments only one P-type device, or only one N-type device, or only one N-type device and only one P-type device is included on a wafer or solar cell substrate.

Thus, voltage breakdown devices for solar cells have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
a semiconductor substrate;
a plurality of alternating N-type and P-type semiconductor regions disposed in or above the substrate;
a plurality of conductive contacts coupled to the plurality of alternating N-type and P-type semiconductor regions; and
a voltage breakdown device disposed above the substrate, the voltage breakdown device comprising one of the plurality of conductive contacts in electrical contact with one of the N-type semiconductor regions and with one of the P-type semiconductor regions of the plurality of alternating N-type and P-type semiconductor regions disposed in or above the substrate to form a P/N junction of the voltage breakdown device, wherein the semiconductor substrate is an N-type semiconductor substrate, the one of the plurality of conductive contacts is in direct contact with the one of the N-type semiconductor regions and is not in direct contact with the one of the P-type semiconductor regions of the plurality of alternating N-type and P-type semiconductor regions.

2. The solar cell of claim 1, wherein another of the plurality of conductive contacts is in direct contact with the one of the P-type semiconductor regions at a location different from a location where the one of the plurality of conductive contacts is in indirect contact with the one of the P-type semiconductor regions.

3. The solar cell of claim 1, wherein an N-type semiconductor layer is disposed between the one of the plurality of conductive contacts and the one of the P-type semiconductor regions of the plurality of alternating N-type and P-type semiconductor regions.

4. The solar cell of claim 3, wherein the N-type semiconductor layer is an N-type doped amorphous silicon layer.

5. The solar cell of claim 3, wherein a tunneling dielectric layer is disposed between the N-type semiconductor layer and the one of the P-type semiconductor regions of the plurality of alternating N-type and P-type semiconductor regions.

6. A solar cell, comprising:
a semiconductor substrate;
a plurality of alternating N-type and P-type semiconductor regions disposed in or above the substrate;
a plurality of conductive contacts coupled to the plurality of alternating N-type and P-type semiconductor regions; and
a voltage breakdown device disposed above the substrate, the voltage breakdown device comprising one of the plurality of conductive contacts in electrical contact with one of the N-type semiconductor regions and with one of the P-type semiconductor regions of the plurality of alternating N-type and P-type semiconductor regions disposed in or above the substrate to form a P/N junction of the voltage breakdown device, wherein the semiconductor substrate is a P-type semiconductor substrate, the one of the plurality of conductive contacts is in direct contact with the one of the P-type semiconductor regions and is not in direct contact with the one of the N-type semiconductor regions of the plurality of alternating N-type and P-type semiconductor regions.

7. The solar cell of claim 6, wherein another of the plurality of conductive contacts is in direct contact with the one of the N-type semiconductor regions at a location different from a location where the one of the plurality of conductive contacts is in indirect contact with the one of the N-type semiconductor regions.

8. The solar cell of claim 6, wherein a P-type semiconductor layer is disposed between the one of the plurality of conductive contacts and the one of the N-type semiconductor regions of the plurality of alternating N-type and P-type semiconductor regions.

9. The solar cell of claim 8, wherein the P-type semiconductor layer is a P-type doped amorphous silicon layer.

10. The solar cell of claim 8, wherein a tunneling dielectric layer is disposed between the P-type semiconductor layer and the one of the N-type semiconductor regions of the plurality of alternating N-type and P-type semiconductor regions.

* * * * *